United States Patent
Iwamoto

(10) Patent No.: US 8,283,223 B2
(45) Date of Patent: Oct. 9, 2012

(54) METHOD OF MANUFACTURING SEMICONDUCTOR DEVICE AND SEMICONDUCTOR DEVICE

(75) Inventor: Toshiyuki Iwamoto, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 123 days.

(21) Appl. No.: 12/789,558

(22) Filed: May 28, 2010

(65) Prior Publication Data
US 2010/0327365 A1 Dec. 30, 2010

(30) Foreign Application Priority Data
Jun. 24, 2009 (JP) .................................. 2009-150113

(51) Int. Cl.
*H01L 21/336* (2006.01)
*H01L 21/8234* (2006.01)
(52) U.S. Cl. ....................................... 438/199; 438/197
(58) Field of Classification Search .......... 438/199–210, 438/300–305, E27.062
See application file for complete search history.

(56) References Cited

U.S. PATENT DOCUMENTS
7,807,990 B2 * 10/2010 Koyama et al. .................. 257/24
2008/0265336 A1 * 10/2008 Ramin et al. .................. 257/392

FOREIGN PATENT DOCUMENTS
JP 2008-053283 3/2008
WO 2004-008544 1/2004
* cited by examiner

*Primary Examiner* — Cuong Q Nguyen
(74) *Attorney, Agent, or Firm* — Young & Thompson

(57) ABSTRACT

A method of manufacturing a semiconductor device includes: forming a gate insulating film over a semiconductor substrate; forming a mask that has an opening at a position corresponding to the gate insulating film formed in an NMOSFET forming region and covers the gate insulating film; forming a first metal layer over the gate insulating film disposed in the NMOSFET forming region and the mask formed in a PMOSFET forming region; and performing a heat treatment to thermally diffuse a metal material forming the first metal layer into the gate insulating film formed in the NMOSFET forming region.

9 Claims, 9 Drawing Sheets

La CONCENTRATION

METHOD OF MANUFACTURING SEMICONDUCTOR DEVICE AND SEMICONDUCTOR DEVICE

This application is based on Japanese patent application No. 2009-150113, the content of which is incorporated hereinto by reference.

BACKGROUND

1. Technical Field

The present invention relates to a method of manufacturing a semiconductor device and a semiconductor device.

2. Related Art

In recent years, with a reduction in the size of LSIs, a driving current has deteriorated due to the depletion of a polysilicon gate electrode of each metal-oxide semiconductor field effect transistor (MOSFET) and the amount of gate leakage current has increased due to a reduction in the thickness of a gate insulating film. Therefore, the following techniques have been examined: a technique that uses a metal gate electrode to avoid the depletion of the electrode; and a technique that forms a gate insulating film made of a high-dielectric-constant material to increase the physical thickness of the film, thereby reducing a gate leakage current.

As an example of a MOSFET including a metal gate electrode and a high-dielectric-constant insulating film, a structure has been proposed in which an interface insulating film made of, for example, $SiO_2$, a high-dielectric-constant insulating film, a metal gate electrode, and a polysilicon gate electrode are laminated on a semiconductor substrate. In the MOSFET having the above-mentioned structure, it is important to adjust a threshold voltage. In an NMOSFET, a very small amount of metal material different from that forming a metal gate electrode locally exists between an interface insulating film and a high-dielectric-constant insulating film to control a work function. In this way, it is possible to reduce the threshold voltage.

Japanese Unexamined patent publication NO. 2008-53283 discloses a technique in which a hafnium silicate insulating film is formed on an underlying insulating film made of, for example, $SiO_2$, and a metal material is patterned by photolithography and a metal etching process to form a metal tantalum film only on the hafnium silicate insulating film of an NMOSFET.

PCT Publication No. WO2004/008544 discloses a technique that thermally diffuses a metal element, such as La, from the surface of a $SiO_2$ gate insulating film in a MOSFET including a gate insulating film made of $SiO_2$. In this way, a gate insulating film structure is manufactured in which the concentration of the metal element is the highest in the surface of the $SiO_2$ gate insulating film, is reduced as the depth of the gate insulating film is increased, and is approximately zero at a predetermined depth from the surface of the gate insulating film.

Next, an example of a method of manufacturing a semiconductor device that patterns a metal material using photolithography and a metal etching process such that La locally exists only between a silicon oxide film 116, which is an interface insulating film, of an NMOSFET and a $HfO_2$ film 118, which is a high-dielectric-constant insulating film, will be described with reference to FIGS. 8A, 8B, and 8C and FIGS. 9A, 9B, and 9C.

First, as shown in FIG. 8A, the silicon oxide film 116 and the $HfO_2$ film 118 are formed on a semiconductor substrate 110. Then, a La film 120 is deposited on the entire surface of the $HfO_2$ film 118 by, for example, a sputtering method. A P well 112, which is an NMOSFET forming region, an N well 113, which is a PMOSFET forming region, and an element isolation insulating film 111 have already been formed on the semiconductor substrate 110.

Then, as shown in FIG. 8B, a resist mask 122 is formed so as to cover only the La film 120 formed in the P well 112. Then, wet etching is performed on the La film 120 exposed from the PMOSFET forming region with a dilute hydrochloric acid, using the resist mask 122 as a mask (FIG. 8C), and the resist mask 122 is removed by $H_2/N_2$ plasma ashing. In this way, as shown in FIG. 9A, the La film 120 is formed only in the NMOSFET forming region, and the $HfO_2$ film 118 is exposed from the PMOSFET forming region.

Then, as shown in FIG. 9B, a metal gate electrode 124 and a polysilicon electrode 126 are formed. As shown in FIG. 9C, the metal gate electrode 124 and the polysilicon electrode 126 are processed into a gate electrode. Then, impurities are implanted to form source and drain regions, a side wall is formed, and a heat treatment is performed to form an NMOSFET and a PMOSFET (not shown). In the NMOSFET, a heat treatment is performed to diffuse La into the $HfO_2$ film 118 and into the interface between the $HfO_2$ film 118 and the silicon oxide film 116.

In the method of manufacturing the semiconductor device, after the La film 120 is formed on the $HfO_2$ film 118 provided in the PMOSFET forming region once, the La film 120 disposed in the PMOSFET forming region is removed by wet etching. In this case, as shown in FIG. 8C, the La film 120 on the $HfO_2$ film 118 that is formed in the PMOSFET forming region is not sufficiently removed by wet etching, but about $1E14$ atoms/$cm^2$ of La 121 remains on the surface of the $HfO_2$ film 118. When a metal gate electrode 124 and a polysilicon electrode 126 are formed on the La 121, the threshold voltage of the PMOSFET is increased.

SUMMARY

In one embodiment, there is provided a method of manufacturing a semiconductor device including a first-conduction-type MOSFET and a second-conduction-type MOSFET over a semiconductor substrate. The method includes: forming a gate insulating film in a first-conduction-type MOSFET forming region and a second-conduction-type MOSFET forming region of the semiconductor substrate; forming a mask that has an opening at a position corresponding to the gate insulating film formed in the first-conduction-type MOSFET forming region and covers the gate insulating film formed in the second-conduction-type MOSFET forming region; forming a first metal layer over the gate insulating film disposed in the first-conduction-type MOSFET forming region and the mask formed in the second-conduction-type MOSFET forming region; and performing a heat treatment to thermally diffuse a metal material forming the first metal layer into the gate insulating film formed in the first-conduction-type MOSFET forming region.

In another embodiment, there is provided a semiconductor device including a semiconductor substrate, and a first-conduction-type MOSFET and a second-conduction-type MOSFET that are provided over the semiconductor substrate. The first-conduction-type MOSFET includes: a first gate insulating film that is provided over the semiconductor substrate and includes a first metal material; and a metal gate electrode that is provided over the first gate insulating film and is made of a second metal material. The concentration of the first metal material in the first gate insulating film has a profile in which the concentration is reduced from an interface between the first gate insulating film and the metal gate electrode made of the second metal material to the semiconductor substrate and has a maximum value in the first gate insulating film. The second-conduction-type MOSFET includes: a second gate insulating film that is provided over the semiconductor substrate; and a metal gate electrode that is provided over the gate insulating film and is made of the second metal material.

According to the above-mentioned structure, the metal material forming the first metal layer is thermally diffused into the gate insulating film, with a metal film disposed on the gate insulating film of the first-conduction-type MOSFET and the mask disposed between the metal film and the gate insulating film of the second-conduction-type MOSFET. Therefore, the metal material forming the first metal layer does not remain on the gate insulating film of the second-conduction-type MOSFET.

According to the above-mentioned embodiments, in the semiconductor device including the first-conduction-type MOSFET and the second-conduction-type MOSFET formed on the semiconductor substrate, the metal material forming the first metal layer does not remain on the gate insulating film of the second-conduction-type MOSFET. Therefore, it is possible to reliably control the threshold voltage of the first-conduction-type MOSFET while preventing an increase in the threshold voltage of the second-conduction-type MOSFET.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1A:
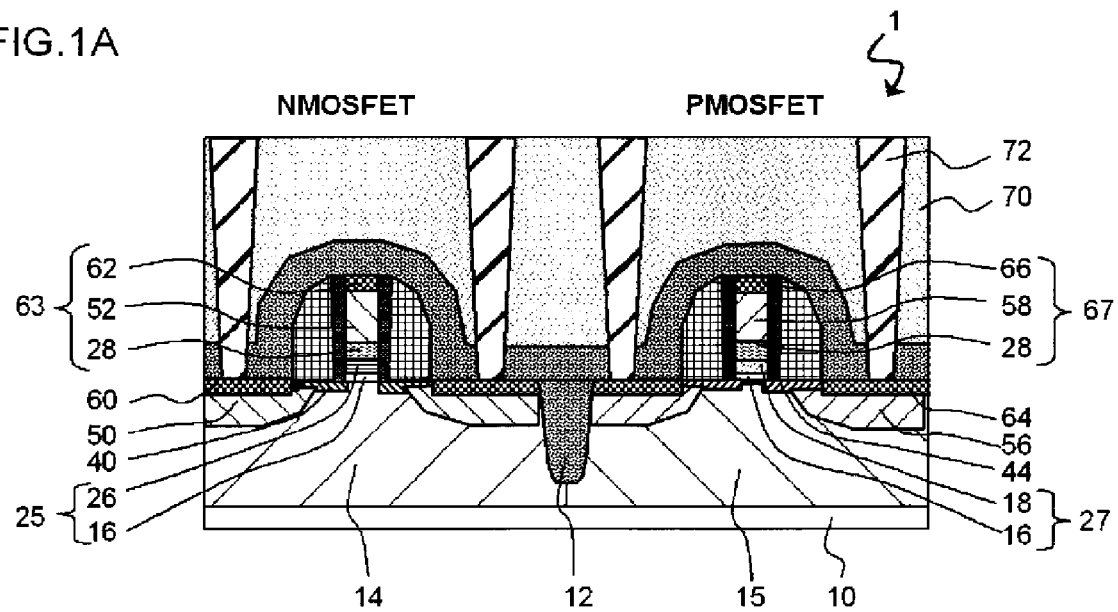
FIG. 1A is a cross-sectional view illustrating a semiconductor device according to an embodiment of the invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, exemplary embodiments of the invention will be described with reference to the accompanying drawings. In the drawings, the same components are denoted by the same reference numerals and a description thereof will not be repeated.

FIG. 1A is a cross-sectional view illustrating a semiconductor device 1 according to an embodiment of the invention. The semiconductor device 1 includes an NMOSFET (first-conduction-type MOSFET) and a PMOSFET (second-conduction-type MOSFET) formed on a semiconductor substrate 10 that is made of, for example, silicon. The NMOSFET is formed in a P well 14 and the PMOSFET is formed in an N well 15. The NMOSFET and the PMOSFET are isolated from each other by an element isolation insulating film 12.

The NMOSFET includes a gate insulating film 25 (first gate insulating film) including La and a metal gate electrode 28 provided on the semiconductor substrate 10. The metal gate electrode 28 is made of at least one metal material selected from a group including TiN, W, TaN, TaSiN, Ru, TiAl, and Al. The gate insulating film 25 includes an interface insulating film 16 and a high-dielectric-constant film 26 with a dielectric constant greater than that of the interface insulating film 16. For example, a silicon oxynitride film, a silicon oxide film, or a silicon nitride film may be used as the interface insulating film 16. The high-dielectric-constant film 26 may be made of, for example, $HfO_2$ or $ZrO_2$. A gate electrode 63 of the NMOSFET has a laminated structure of the metal gate electrode 28, a silicon electrode 52, and a silicide layer 62.

Figure 1B:
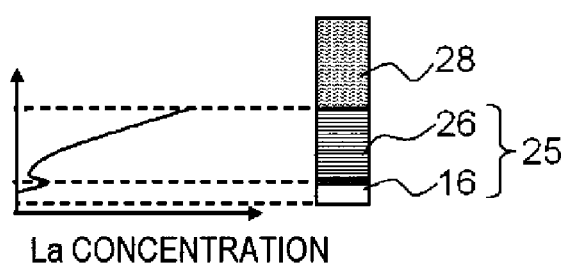
FIG. 1B is a diagram illustrating a La concentration profile in a gate insulating film of the semiconductor device according to an embodiment of the invention.

FIG. 1B is a diagram illustrating a La concentration profile in the gate insulating film 25. The concentration of La in the gate insulating film 25 has a profile in which the concentration is reduced from the interface between the gate insulating film 25 and the metal gate electrode 28 to the semiconductor substrate 10 and has a maximum value in the gate insulating film 25. Specifically, the concentration of La has a profile in which the concentration is reduced from the interface between the high-dielectric-constant film 26 and the metal gate electrode 28 to the interface insulating film 16 and has a maximum value in the interface between the high-dielectric-constant film 26 and the interface insulating film 16.

La is used as a metal material for controlling the threshold voltage of the NMOSFET. In the NMOSFET, La in the interface between the high-dielectric-constant film 26 and the interface insulating film 16 makes it possible to control the threshold voltage. At least one metal material selected from a group including La, Dy, $La_2O_3$, and $Dy_2O_3$ may be used as the metal material for controlling the threshold voltage.

The PMOSFET includes a gate insulating film 27 (second gate insulating film) and the metal gate electrode 28 provided on the semiconductor substrate 10. The gate insulating film 27 includes the interface insulating film 16 and a high-dielectric-constant film 18 with a dielectric constant greater than that of the interface insulating film 16. For example, a silicon oxynitride film, a silicon oxide film, or a silicon nitride film may be used as the interface insulating film 16. The high-dielectric-constant film 18 may be made of, for example, $HfO_2$ or $ZrO_2$. The high-dielectric-constant film 18 does not include La therein and in the upper and lower interfaces. A gate electrode 67 of the PMOSFET has a laminated structure of the metal gate electrode 28, a silicon electrode 58, and a silicide layer 66.

The NMOSFET further includes an extension region 40, a deep SD region 50, and a silicide layer 60. The PMOSFET further includes an extension region 44, a deep SD region 56, and a silicide layer 64. An interlayer film 70 is formed on the NMOSFET and the PMOSFET. Contacts 72 connected to the NMOSFET and the PMOSFET are embedded in the interlayer film 70.

Figure 2A:
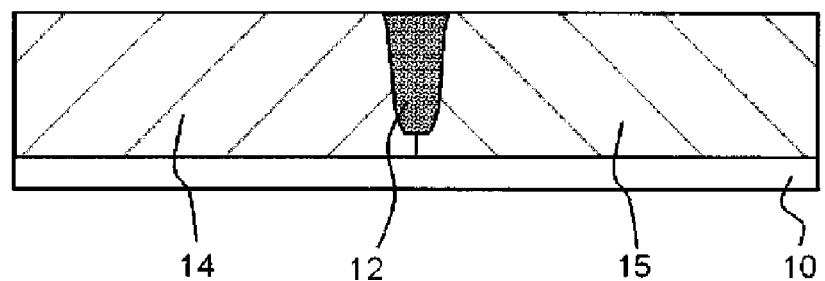
FIGS. 2A to 2D are cross-sectional views illustrating a process of manufacturing the semiconductor device according to the embodiment of the invention.

Next, a method of manufacturing the semiconductor device according to the embodiment of the invention will be described with reference to FIGS. 2A to 7D. First, as shown in FIG. 2A, the element isolation insulating film 12 is formed on the semiconductor substrate 10. The element isolation insulating film 12 is formed by, for example, a shallow trench isolation (STI) method. Then, the P well 14 is formed in an NMOSFET forming region and the N well 15 is formed in a PMOSFET forming region.

Figure 2B:
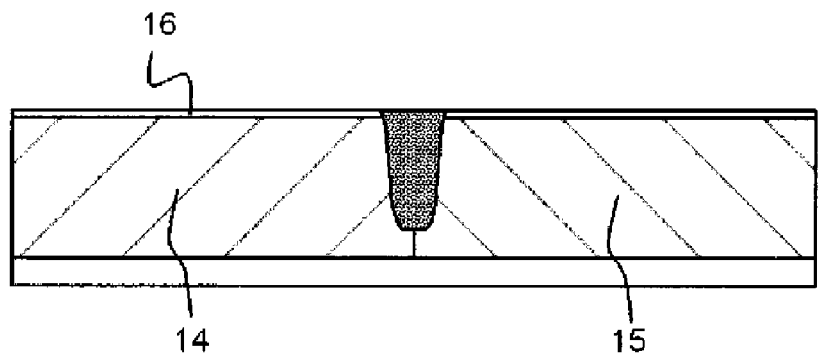

Then, as shown in FIG. 2B, a silicon oxynitride film with a thickness of 1.0 nm is formed as the interface insulating film 16 in the NMOSFET forming region and the PMOSFET forming region. For example, the interface insulating film 16 is formed by forming a silicon oxide film with a mixture of a sulfuric acid and a hydrogen peroxide solution, ozone water, hydrochloric acid/ozone water, and thermal oxidation, and performing plasma nitridation.

Figure 2C:
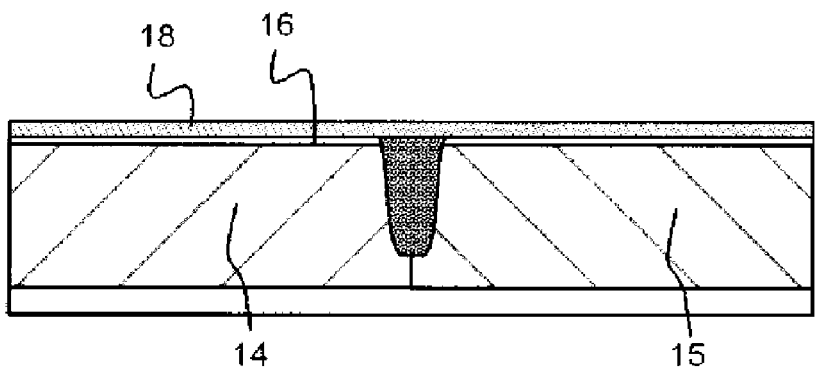

Then, as shown in FIG. 2C, the high-dielectric-constant film 18 is formed on the interface insulating film 16. The high-dielectric-constant film 18 is an insulating film made of $HfO_2$ or $ZrO_2$. In this embodiment, a $HfO_2$ film is used. The thickness of the high-dielectric-constant film 18 is equal to or more than 1.0 nm and equal to or less than 5.0 nm. The high-dielectric-constant film 18 is formed by, for example, a CVD method, an ALCVD method, or a sputtering method.

Figure 2D:
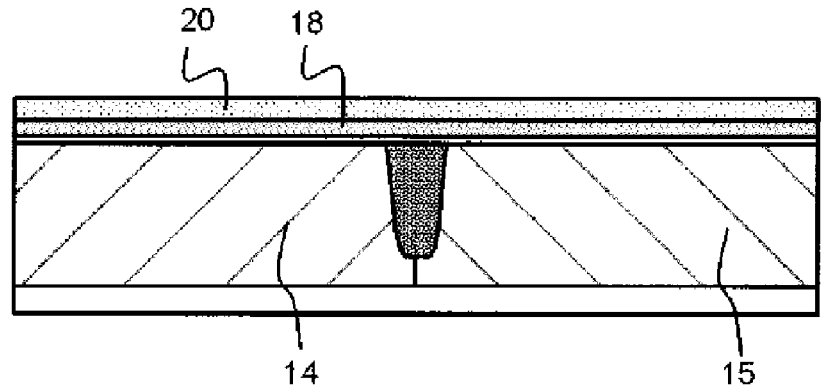

Then, as shown in FIG. 2D, the silicon oxide film 20 is formed on the entire surface of the high-dielectric-constant film 18 in the NMOSFET forming region and the PMOSFET forming region. The thickness of the silicon oxide film 20 is equal to or more than 2 nm and equal to or less than 10 nm. The silicon oxide film 20 may be formed by, for example, a CVD method or a sputtering method. The silicon oxide film 20 is used as a hard mask when La is selectively diffused into the high-dielectric-constant film of the NMOSFET, which will be described below. When a hard mask is used for the diffusion of La, for example, an amorphous carbon or silicon nitride film may be used instead of the silicon oxide film.

Figure 3A:
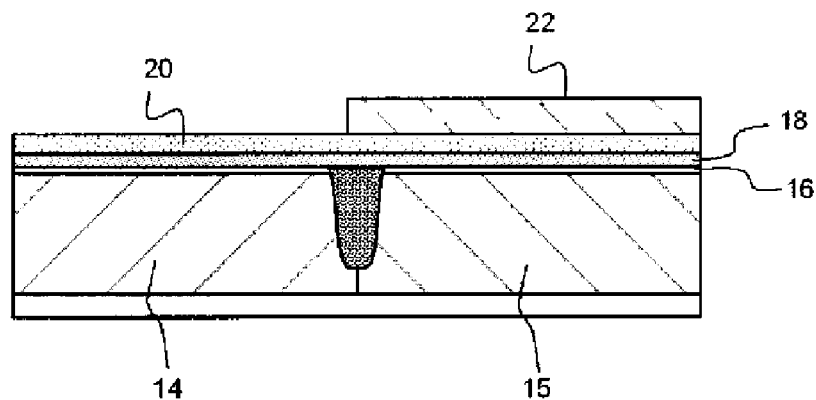
FIGS. 3A to 3D are cross-sectional views illustrating the process of manufacturing the semiconductor device according to the embodiment of the invention.

Then, as shown in FIG. 3A, a resist is formed so as to cover the entire surface of the silicon oxide film 20, and the resist in the NMOSFET forming region is opened to expose the silicon oxide film 20 in the NMOSFET forming region. In this way, a resist mask 22 is formed.

Figure 3B:
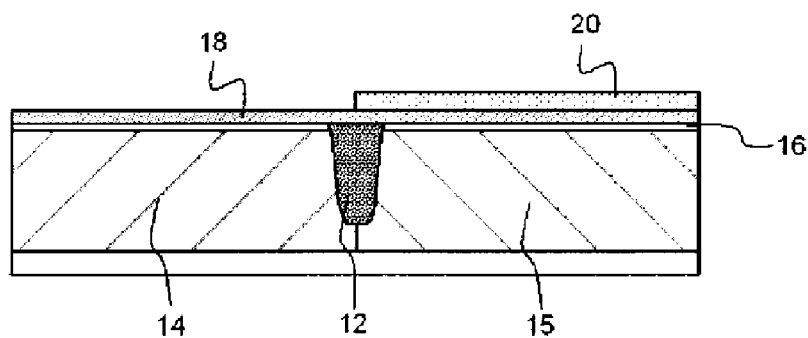

Then, as shown in FIG. 3B, the silicon oxide film 20 in the NMOSFET forming region is removed. In this way, an opening of the silicon oxide film 20 is formed in the NMOSFET forming region. It is preferable that the edge of the opening be disposed above the element isolation insulating film 12. The silicon oxide film 20 may be removed by wet etching using dilute HF or dry etching. In addition, the resist mask 22 is removed by a wet process using a sulfuric acid-hydrogen peroxide solution. Alternatively, the resist mask 22 may be removed by, for example, oxygen plasma ashing or $M_2/N_2$ ashing instead of the wet process using the sulfuric acid-hydrogen peroxide solution.

Figure 3C:
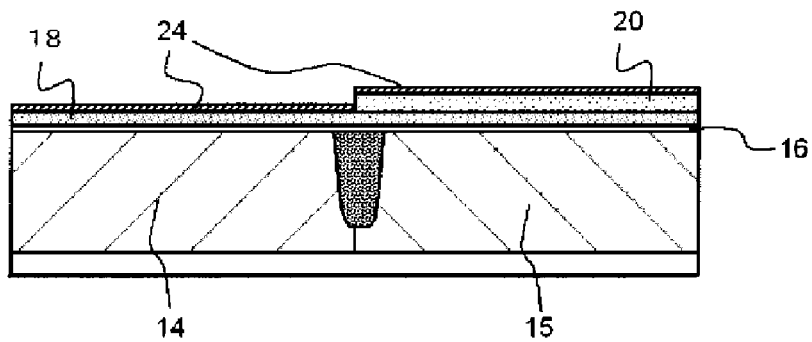

Then, as shown in FIG. 3C, a La film 24 is formed on the entire surface by a sputtering method. The thickness of the La film 24 is equal to or more than 0.1 nm and equal to or less than 2.0 nm. Instead of the La film 24, a Dy film, a $La_2O_3$ film, or a $Dy_2O_3$ film may be used.

Figure 3D:
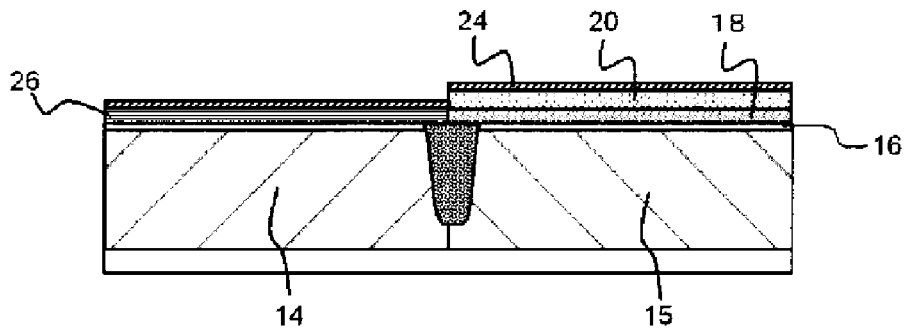

Then, as shown in FIG. 3D, a heat treatment is performed to diffuse La into the high-dielectric-constant film 18 of the NMOSFET, using the silicon oxide film 20 as a hard mask. In this way, the high-dielectric-constant film 26 including La is formed in the NMOSFET. The heat treatment temperature is equal to or more than 900° C. and equal to or less than 1100° C. The heat treatment time is equal to or more than 10 msec and equal to or less than 30 sec. In this way, as shown in FIG. 1B, the concentration of La has the profile in which the concentration is reduced from the interface between the high-dielectric-constant film 26 including La and the metal gate electrode 28 to the interface insulating film 16. Since the diffusion speed of La in the interface insulating film 16, which is a silicon oxynitride film, is low, a concentration profile is obtained in which the concentration is locally increased in the interface between the high-dielectric-constant film 26 and the interface insulating film 16. In this case, only 1E13 atoms/$cm^2$ or less of La reacts with the silicon oxide film 20 at the interface between the silicon oxide film 20 and the La film 24. Therefore, La is not diffused into the high-dielectric-constant film 18 of the PMOSFET forming region.

Figure 4A:
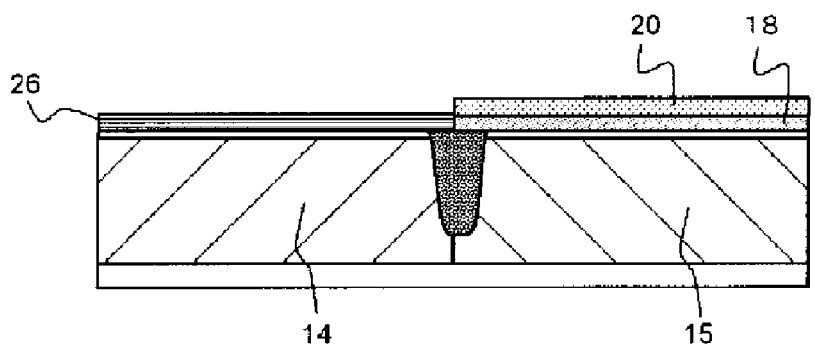
FIGS. 4A to 4D are cross-sectional views illustrating the process of manufacturing the semiconductor device according to the embodiment of the invention.
Figure 4B:
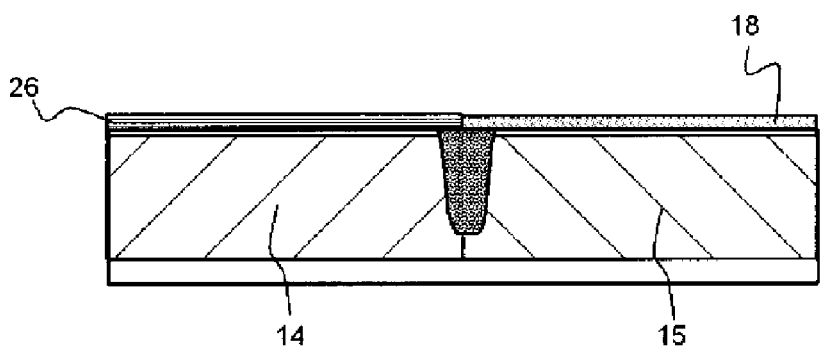

Then, as shown in FIG. 4A, the remaining La film 24 is removed. The La film 24 is removed by, for example, a dilute hydrochloric acid. Then, as shown in FIG. 4B, the silicon oxide film 20 in the PMOSFET forming region is removed by dilute HF.

Figure 4C:
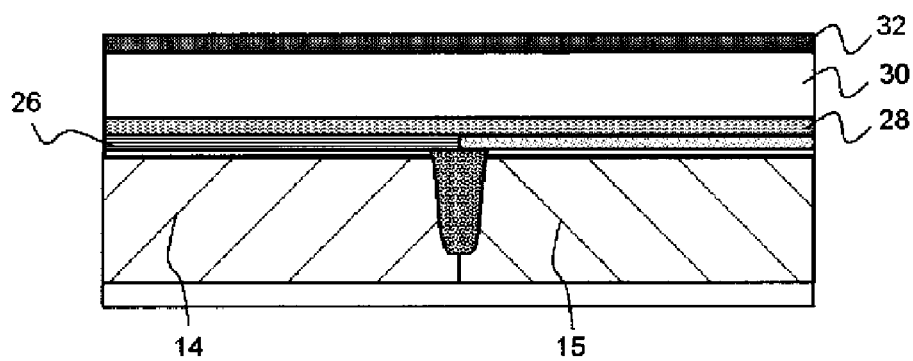

As shown in FIG. 4C, the metal gate electrode 28 made of a second metal material different from a first metal material is formed. The metal gate electrode 28 is made of at least one metal material selected from TiN, W, TaN, TaSiN, Ru, TiAl, and Al. The thickness of the metal gate electrode 28 is equal to or more than 1.0 nm and equal to or less than 20.0 nm. Then, a silicon electrode 30 made of amorphous silicon is formed. The thickness of the silicon electrode 30 is equal to or more than 10 nm and equal to or less than 100 nm. The silicon electrode 30 may be made of polysilicon instead of the amorphous silicon. Then, a hard mask 32 is formed on the silicon electrode 30. The hard mask 32 is a silicon oxide film or a silicon nitride film.

Figure 4D:
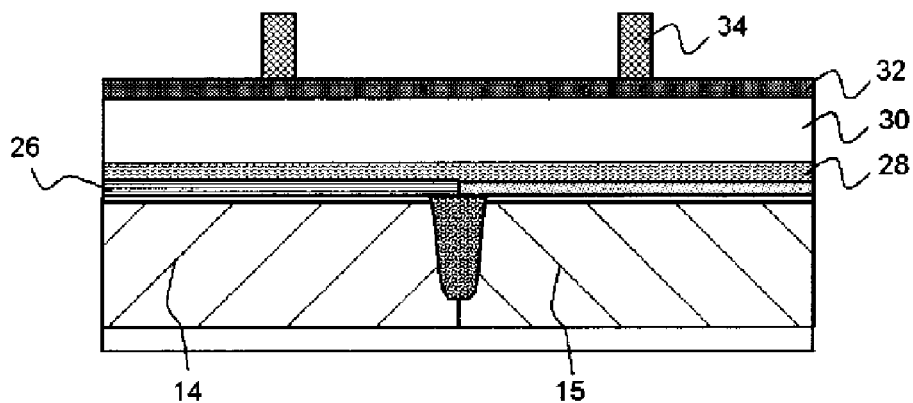
Figure 5A:
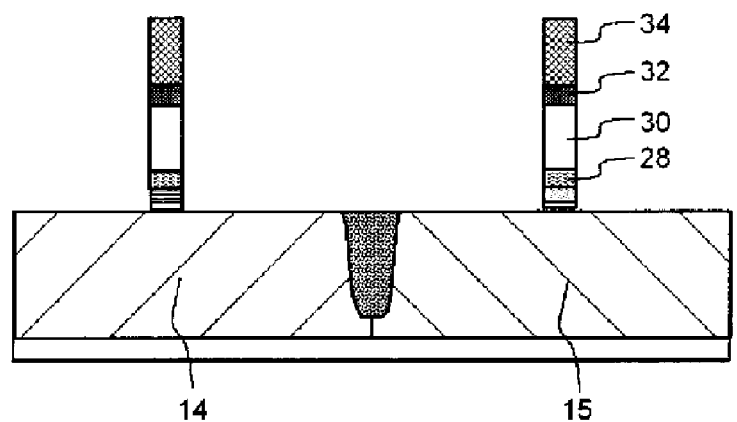
FIGS. 5A to 5D are cross-sectional views illustrating the process of manufacturing the semiconductor device according to the embodiment of the invention.
Figure 5B:
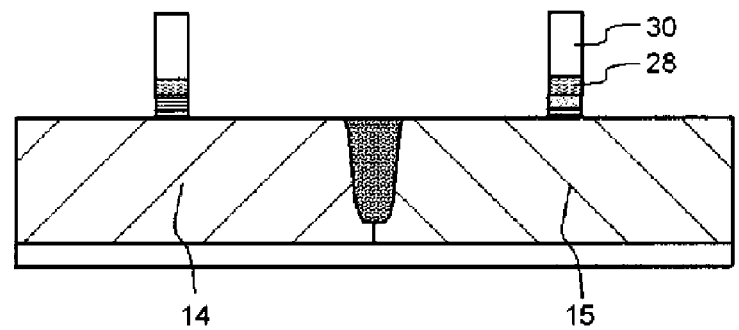

As shown in FIG. 4D, a resist mask 34 is formed on the hard mask 32. Then, as shown in FIG. 5A, the gate insulating film and the gate electrode are processed in a gate shape by dry etching and a wet process. Then, as shown in FIG. 5B, the resist mask 34 and the hard mask 32 are removed.

Figure 5C:
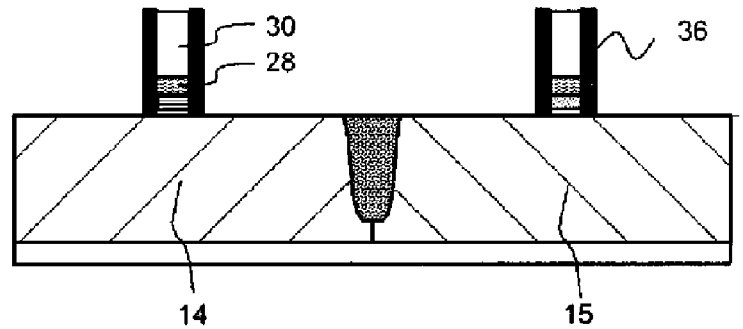

As shown in FIG. 5C, a silicon nitride film is formed by an ALCVD method and offset spacers 36 are formed. A film for the offset spacers 36 may be a silicon oxide film or a laminated structure of a silicon nitride film and a silicon oxide film.

Figure 5D:
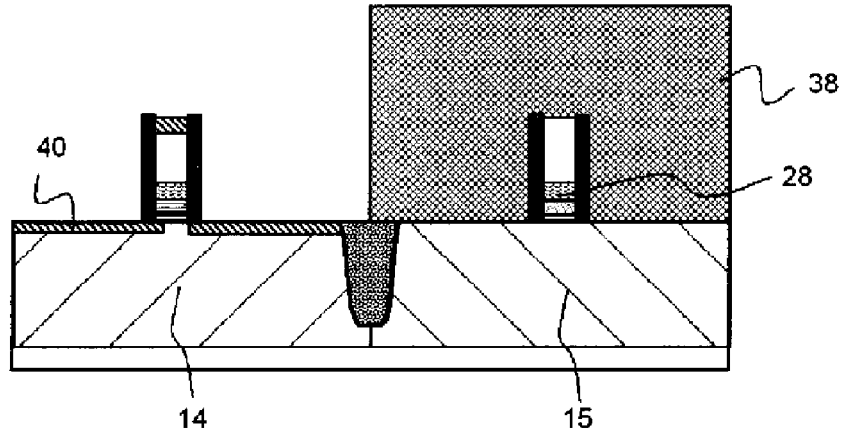

Then, as shown in FIG. 5D, the extension region 40 is formed in the NMOSFET forming region by ion implantation, with the resist mask 38 placed on the PMOSFET forming region. The implantation conditions are as follows: As 2 keV 8E14 atoms/$cm^2$ 0 degree and $BF_2$ 50 keV 3E13 atoms/$cm^2$ 30 degrees.

Figure 6A:
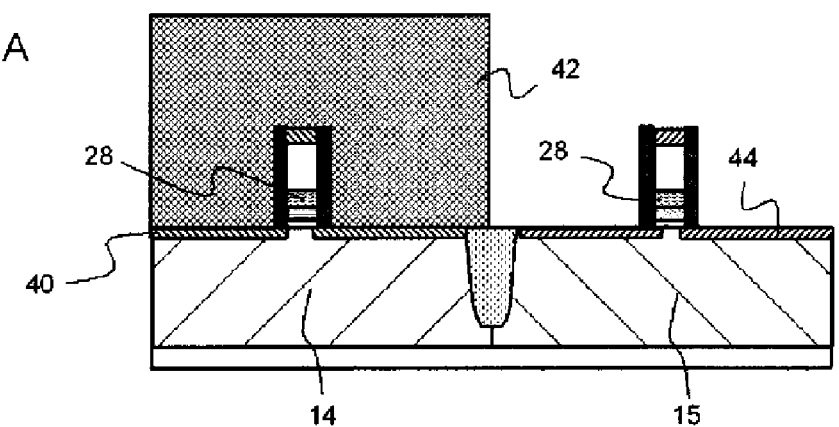
FIGS. 6A to 6D are cross-sectional views illustrating the process of manufacturing the semiconductor device according to the embodiment of the invention.

Then, as shown in FIG. 6A, similarly, the extension region 44 is formed in the PMOSFET region by ion implantation, with a resist mask 42 placed on the NMOSFET forming region. The implantation conditions are as follows: $BF_2$ 3 keV 8E14 atoms/$cm^2$ 0 degree and As 50 keV 3E13 atoms/$cm^2$ 30 degrees.

Figure 6B:
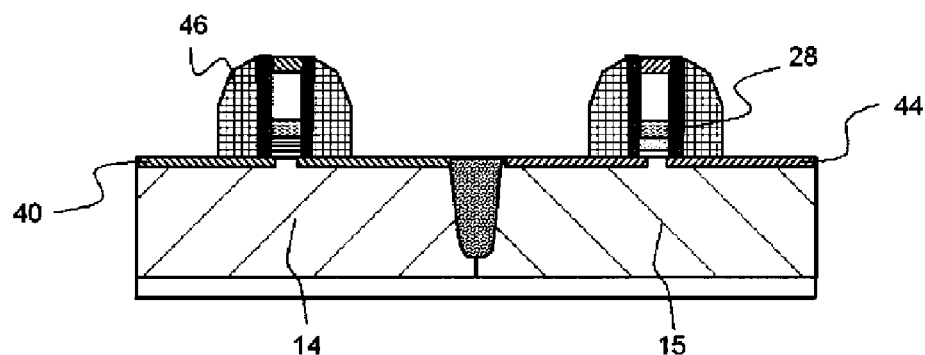

Then, a silicon nitride film or a silicon oxide film is formed and dry etching is performed to form side wall spacers 46, as shown in FIG. 6B.

Figure 6C:
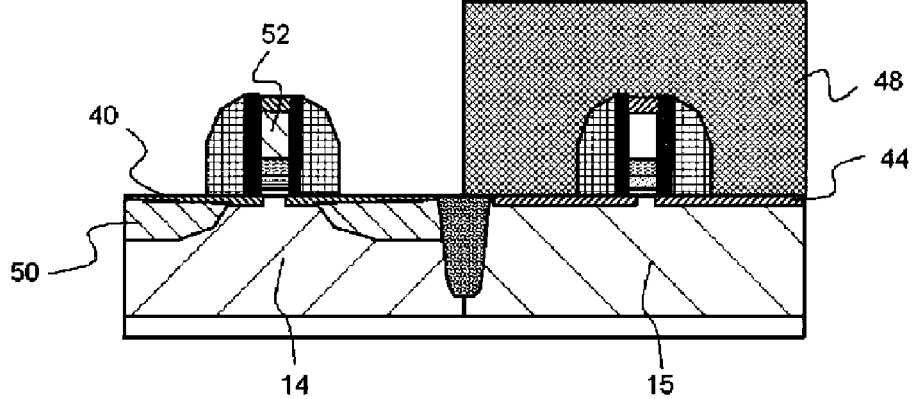

Then, as shown in FIG. 6C, the deep SD region 50 is formed in the NMOSFET forming region by ion implantation, with the resist mask 48 placed on the PMOSFET forming region. The implantation conditions are as follows: As 20 keV 3E15 atoms/$cm^2$ 0 degree and P 20 keV 5E13 atoms/$cm^2$ 0 degree. In this case, the ion implantation is also performed on the silicon electrode to form an N-type silicon electrode 52.

Figure 6D:
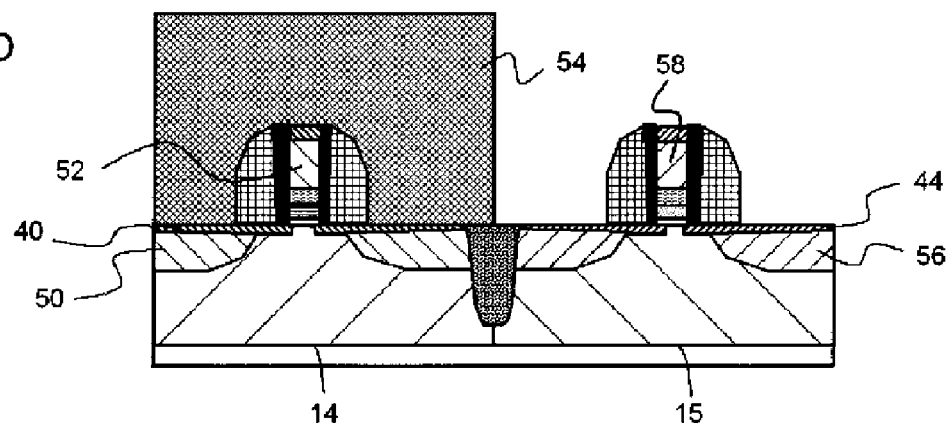

Then, as shown in FIG. 6D, the resist mask 48 is removed. Then, similarly, the deep SD region 56 is formed in the PMOSFET region by ion implantation, with the resist mask 54 placed on the NMOSFET forming region. The implantation conditions are as follows: B 7 keV 5.0E13 atoms/cm$^2$ 0 degree and BF$_2$ 9 keV 2E15 atoms/cm$^2$ 0 degree. In this case, the ion implantation is also performed on the silicon electrode to form a P-type silicon electrode 58.

Then, the resist mask 54 is removed and a heat treatment is performed to activate the extension region and the deep SD region. The heat treatment is performed at a temperature of 1050° C. for 0 second.

Figure 7A:
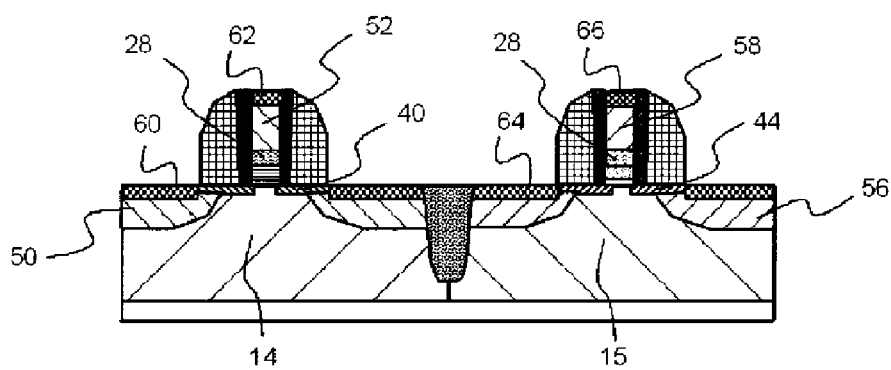
FIGS. 7A to 7D are cross-sectional views illustrating the process of manufacturing the semiconductor device according to the embodiment of the invention.

Then, as shown in FIG. 7A, the silicide layers 60, 62, 64, and 66 are formed. The silicide layers 60, 62, 64, and 66 are formed as follows. First, a metal film, such as a NiPt alloy film, is formed with a thickness of about 8 nm by a sputtering method. The content of Pt in the NiPt alloy film is about 5%. Then, a heat treatment is performed at a temperature of 375° C. to form a primary silicide layer. Then, an unreacted NiPt film is removed by a nitrohydrochloric acid to expose the surface of the primary silicide layer. Then, a heat treatment is performed at a temperature of 500° C. to form a secondary silicide layer. In this way, for example, the silicide layers 60, 62, 64, and 66 made of NiPtSi are formed. The silicide layers 60, 62, 64, and 66 may be made of NiSi or PtSi instead of NiPtSi.

Figure 7B:
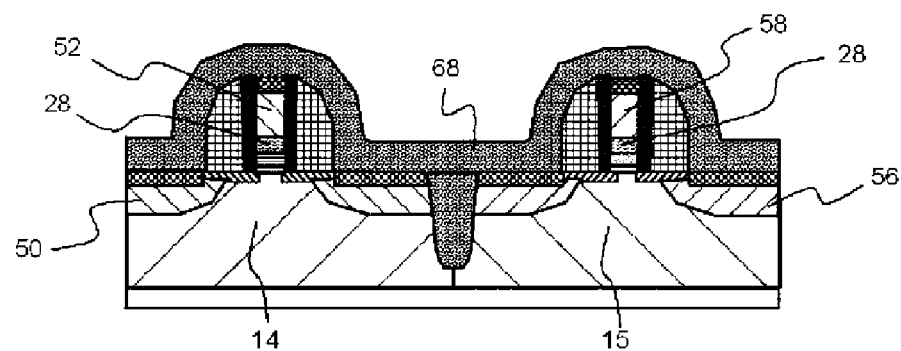
Figure 7C:
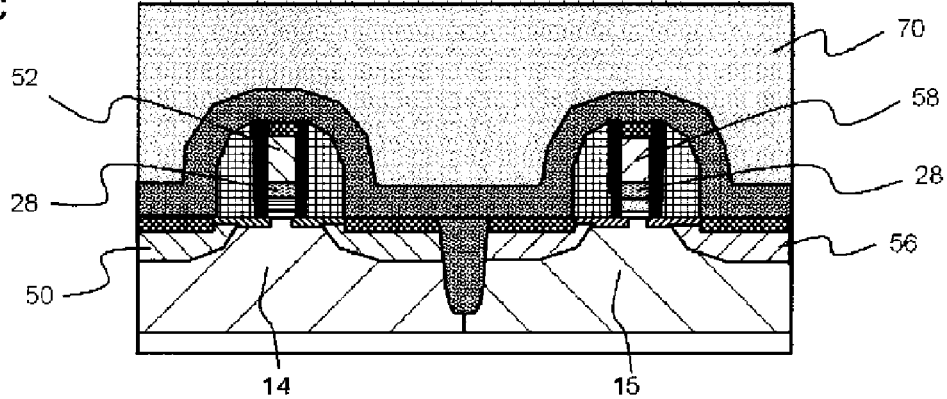
Figure 7D:
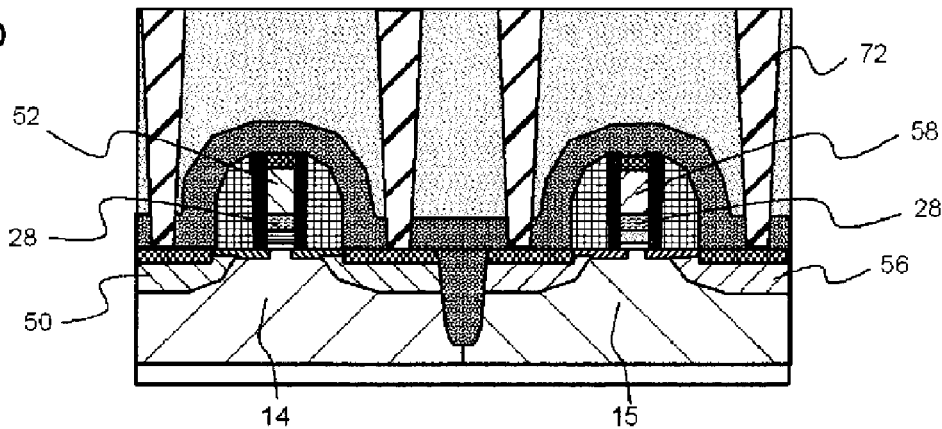

Then, as shown in FIG. 7B, a contact etching stopper film 68 is formed. The contact etching stopper film 68 is a silicon nitride film. The thickness of the contact etching stopper film 68 is equal to or more than 10 nm and equal to or less than 100 nm. As shown in FIG. 7C, an interlayer insulation film 70, which is a silicon oxide film, is formed. Then, as shown in FIG. 7D, contacts 72 are formed.

Next, the operation and effects of this embodiment will be described. In the method of manufacturing the semiconductor device according to this embodiment, as shown in FIG. 3D, La is thermally diffused, with the high-dielectric-constant film 18 of the PMOSFET covered with a hard mask, which is the silicon oxide film 20. In this case, only 1E13 atoms/cm$^2$ or less of La reacts with the silicon oxide film 20 in the PMOSFET forming region at the interface between the silicon oxide film 20 and the La film 24. Therefore, La is not diffused into the high-dielectric-constant film 18 in the PMOSFET forming region. As a result, after the remaining La and the remaining silicon oxide film 20 are removed, La does not remain on the gate insulating film of the PMOSFET. Therefore, it is possible to reliably control the threshold voltage of the NMOSFET while preventing an increase in the threshold voltage of the PMOSFET.

In FIG. 3B, a sulfuric acid-hydrogen peroxide solution may be used to remove the resist mask 22. This is because the base of the resist mask 22 is the silicon oxide film 20. As such, since it is possible to remove the resist mask 22 without using N$_2$/N$_2$ plasma, the high-dielectric-constant film or the silicon oxynitride film is not nitrided. Therefore, the threshold voltage of the MOSFET does not vary. This is very effective in removing the resist mask 22 and performing the process again when the resist mask 22 is misaligned in patterning.

Figure 8A:
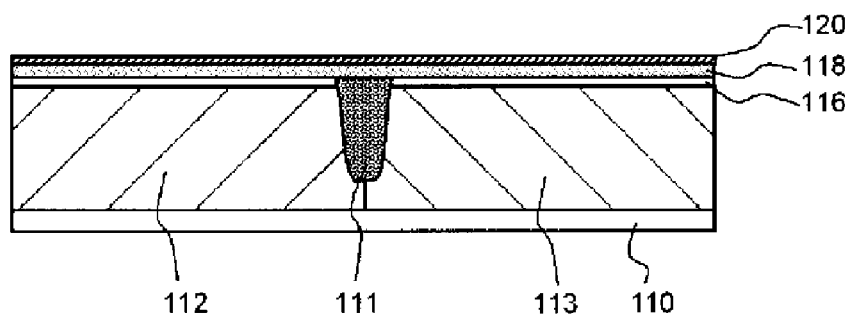
FIGS. 8A to 8C are cross-sectional views illustrating an example of a process of manufacturing a semiconductor device according to the related art.
Figure 8B:
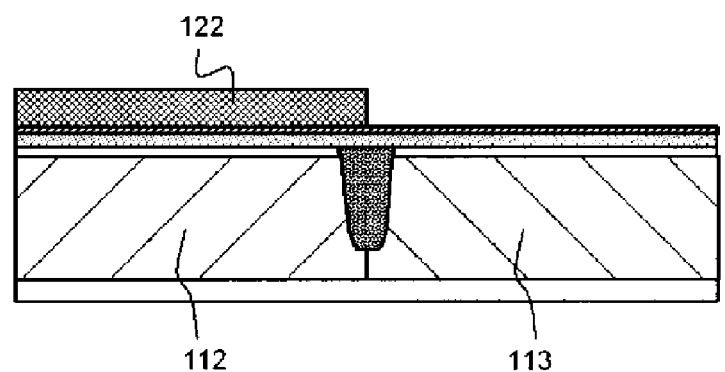
Figure 8C:
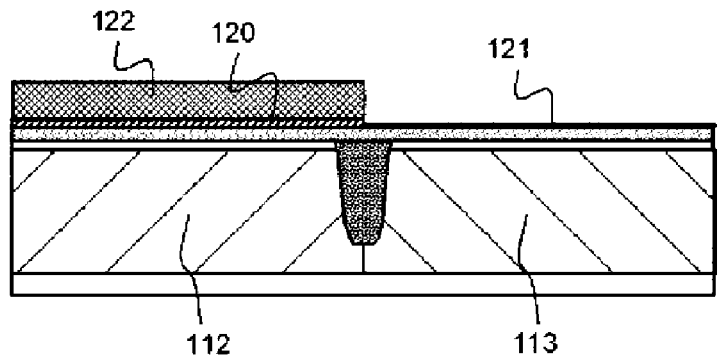
Figure 9A:
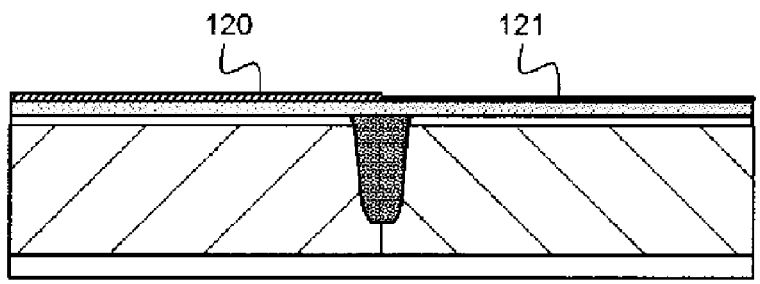
FIGS. 9A to 9C are cross-sectional views illustrating an example of the process of manufacturing the semiconductor device according to the related art.
Figure 9B:
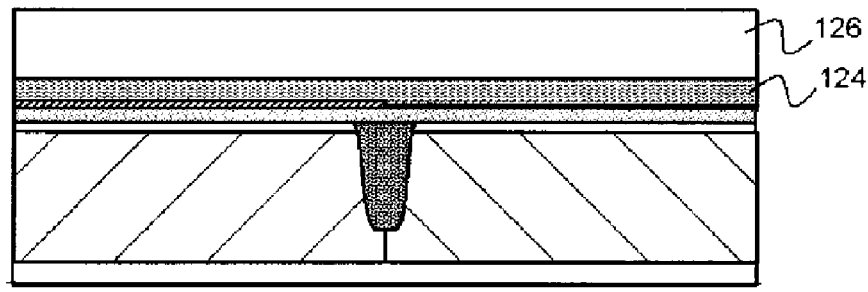
Figure 9C:
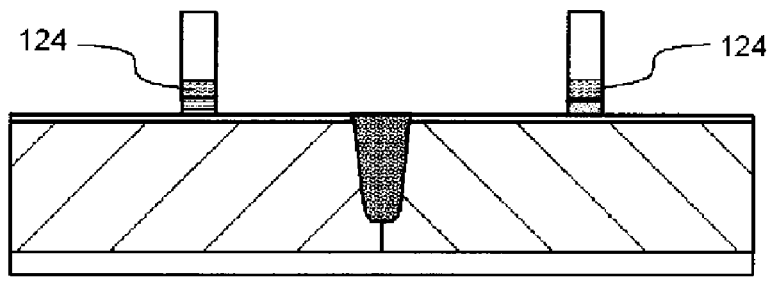

In contrast, according to the manufacturing method shown in FIGS. 8A to 8C, in the process shown in FIG. 8B, when the resist 122 is removed and the process is performed again due to the generation of a patterning deviation, it is necessary to perform ashing in a non-oxidative atmosphere, such as H$_2$/N$_2$. In this case, a HfO$_2$ film 118 and a silicon oxide film 116 are nitrided by H$_2$/N$_2$ plasma and a desired threshold voltage varies.

The semiconductor device according to the invention is not limited to the above-described embodiment, but various modifications thereof can be made. For example, in the above-described embodiment, La is diffused into the high-dielectric-constant film 18 of the NMOSFET, but La is not diffused into the high-dielectric-constant film 18 of the PMOSFET. However, Al may be diffused into the high-dielectric-constant film 18 of the PMOSFET and Al may not be diffused into the high-dielectric-constant film 18 of the NMOSFET. In this case, the high-dielectric-constant film 18 of the NMOSFET forming region may be covered with a hard mask, which is a silicon oxide film, and an Al film or an Al$_2$O$_3$ film may be formed on the entire surface of the high-dielectric-constant film 18. Then, a heat treatment may be performed to diffuse Al into the high-dielectric-constant film 18 of the PMOSFET. In this way, it is possible to reliably control the threshold voltage of the PMOSFET while preventing an increase in the threshold voltage of the NMOSFET.

It is apparent that the present invention is not limited to the above embodiment, but may be modified and changed without departing from the scope and spirit of the invention.

What is claimed is:

1. A method of manufacturing a semiconductor device including a first-conduction-type MOSFET and a second-conduction-type MOSFET over a semiconductor substrate, comprising:

forming a gate insulating film in a first-conduction-type MOSFET forming region and a second-conduction-type MOSFET forming region of said semiconductor substrate;

forming a hard mask that has an opening at a position corresponding to said gate insulating film formed in said first-conduction-type MOSFET forming region and covers said gate insulating film formed in said second-conduction-type MOSFET forming region;

forming a first metal layer over said gate insulating film disposed in said first-conduction-type MOSFET forming region and said hard mask formed in said second-conduction-type MOSFET forming region;

performing a heat treatment to thermally diffuse a metal material forming said first metal layer into said gate insulating film formed in said first-conduction-type MOSFET forming region;

removing said remaining first metal layer from said first-conduction-type MOSFET forming region and said second-conduction-type MOSFET forming region;

removing said hard mask from said second-conduction-type MOSFET forming region;

forming a second metal layer that is made of a metal material different from that forming said first metal layer over said gate insulating film in said first-conduction-type MOSFET forming region and said second-conduction-type MOSFET forming region of said semiconductor substrate, said second metal layer being part of gate electrodes of said first-conduction-type MOSFET and said second-conduction-type MOSFET; and forming a silicon layer over said second metal layer, said silicon layer being part of said gate electrodes of said first-conduction-type MOSFET and said second-conduction-type MOSFET, wherein said forming said gate insulating film includes:
forming a first insulating film; and
forming a second insulating film with a dielectric constant greater than that of said first insulating film, wherein said forming said hard mask includes:
  forming a film that is made of the same material as that forming said hard mask over the entire surface of said gate insulating film in said first-conduction-type MOSFET forming region and said second-conduction-type MOSFET forming region;
  forming a resist so as to cover the entire surface of said film;
  forming an opening in said resist in said first-conduction-type MOSFET forming region to expose said film;
  removing said film exposed from said opening of said resist to expose said gate insulating film in said first-conduction-type MOSFET forming region; and
  removing said resist using a wet process.

2. The method of manufacturing a semiconductor device according to claim 1,
  wherein said mask is made of at least one selected from a group including $SiO_2$, a silicon nitride film, and amorphous carbon.

3. The method of manufacturing a semiconductor device according to claim 1, further comprising:
  forming a silicon oxynitride film in said first-conduction-type MOSFET forming region and said second-conduction-type MOSFET forming region of said semiconductor substrate before said forming said gate insulating film.

4. The method of manufacturing a semiconductor device according to claim 1,
  wherein said first-conduction-type MOSFET is an NMOSFET,
  said second-conduction-type MOSFET is a PMOSFET, and
  said first metal film is made of at least one selected from a group including La, Dy, $La_2O_3$, and $Dy_2O_3$.

5. The method of manufacturing a semiconductor device according to claim 1,
  wherein said gate insulating film is made of $HfO_2$ or $ZrO_2$.

6. The method of manufacturing a semiconductor device according to claim 1,
  wherein said second metal layer is made of at least one selected from a group including TiN, W, TaN, TaSiN, Ru, TiAl, and Al.

7. A method of manufacturing a semiconductor device including a first-conduction-type MOSFET and a second-conduction-type MOSFET over a semiconductor substrate, comprising:
  forming a gate insulating film in a first-conduction-type MOSFET forming region and a second-conduction-type MOSFET forming region of said semiconductor substrate;
  forming a hard mask that has an opening at a position corresponding to said gate insulating film formed in said first-conduction-type MOSFET forming region and covers said gate insulating film formed in said second-conduction-type MOSFET forming region;
  forming a first metal layer over said gate insulating film disposed in said first-conduction-type MOSFET forming region and said hard mask formed in said second-conduction-type MOSFET forming region;
  performing a heat treatment to thermally diffuse a metal material forming said first metal layer into said gate insulating film formed in said first-conduction-type MOSFET forming region;
  removing a remainder of said first metal layer from said first-conduction-type MOSFET forming region and said second-conduction-type MOSFET forming region;
  removing said hard mask from said second-conduction-type MOSFET forming region;
  forming a second metal layer that is made of a metal material different from that forming said first metal layer over said gate insulating film in said first-conduction-type MOSFET forming region and said second-conduction-type MOSFET forming region of said semiconductor substrate, said second metal layer being part of gate electrodes of said first-conduction-type MOSFET and said second-conduction-type MOSFET, wherein said second metal layer is made of at least one metal selected from a group including TiN, W, TaN, TaSiN, Ru, TiAl, and Al; and
  forming a silicon layer over said second metal layer, said silicon layer being part of said gate electrodes of said first-conduction-type MOSFET and said second-conduction-type MOSFET,
  wherein said forming said gate insulating film includes:
  forming a first insulating film; and
  forming a second insulating film with a dielectric constant greater than that of said first insulating film,
  wherein said forming said hard mask includes:
  forming a film that is made of the same material as that forming said hard mask over the entire surface of said gate insulating film in said first-conduction-type MOSFET forming region and said second-conduction-type MOSFET forming region;
  forming a resist so as to cover the entire surface of said film;
  forming an opening in said resist in said first-conduction-type MOSFET forming region to expose said film;
  removing said film exposed from said opening of said resist to expose said gate insulating film in said first-conduction-type MOSFET forming region; and
  removing said resist using a wet process.

8. The method of manufacturing a semiconductor device according to claim 7,
  wherein said first-conduction-type MOSFET is an NMOSFET,
  said second-conduction-type MOSFET is a PMOSFET, and
  said first metal film is made of at least one selected from a group including La, Dy, $La_2O_3$, and $Dy_2O_3$.

9. The method of manufacturing a semiconductor device according to claim 7,
  wherein said gate insulating film is made of $HfO_2$ or $ZrO_2$.

* * * * *